United States Patent
Hamada

(10) Patent No.: US 8,128,261 B2
(45) Date of Patent: Mar. 6, 2012

(54) LIGHT EMITTING ELEMENT, LIGHT EMITTING ELEMENT ARRAY, BACKLIGHT UNIT, AND LIQUID CRYSTAL DISPLAY

(75) Inventor: Tetsuya Hamada, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 430 days.

(21) Appl. No.: 12/307,381

(22) PCT Filed: Feb. 20, 2007

(86) PCT No.: PCT/JP2007/053011
§ 371 (c)(1),
(2), (4) Date: Jan. 5, 2009

(87) PCT Pub. No.: WO2008/023468
PCT Pub. Date: Feb. 28, 2008

(65) Prior Publication Data
US 2010/0134716 A1    Jun. 3, 2010

(30) Foreign Application Priority Data

Aug. 25, 2006   (JP) .................. 2006-228646

(51) Int. Cl.
*F21V 5/04*     (2006.01)
*F21V 7/04*     (2006.01)
(52) U.S. Cl. ................... 362/311.02; 362/327; 362/307; 362/97.3; 362/612

(58) Field of Classification Search ............. 362/311.02, 362/311.06, 326, 327, 241, 245, 247, 97.3, 362/329, 307, 308, 309, 235, 249.01, 612, 362/613
See application file for complete search history.

(56) References Cited

U.S. PATENT DOCUMENTS

| | | | |
|---|---|---|---|
| 4,884,178 A * | 11/1989 | Roberts ........................ 362/241 |
| 5,506,760 A * | 4/1996 | Giebler et al. ........... 362/249.06 |
| 6,121,637 A | 9/2000 | Isokawa et al. |
| 6,547,423 B2 * | 4/2003 | Marshall et al. ............... 362/333 |
| 6,679,618 B1 * | 1/2004 | Suckow et al. ............... 362/247 |
| 6,819,506 B1 * | 11/2004 | Taylor et al. .................. 359/726 |
| 6,828,590 B2 * | 12/2004 | Hsiung ........................... 257/79 |
| 2005/0168985 A1 * | 8/2005 | Chen ........................... 362/241 |
| 2006/0125716 A1 | 6/2006 | Wong et al. |

FOREIGN PATENT DOCUMENTS

| | | |
|---|---|---|
| JP | 10-215002 A | 8/1998 |
| JP | 11-112025 A | 4/1999 |
| JP | 2006-064733 A | 3/2006 |
| JP | 2006-210627 A | 8/2006 |

OTHER PUBLICATIONS

Official Communication issued in International Patent Application No. PCT/JP2007/053011, mailed on Apr. 10, 2007.

* cited by examiner

*Primary Examiner* — Bao Q Truong
(74) *Attorney, Agent, or Firm* — Keating & Bennett, LLP

(57) ABSTRACT

An LED package housing member that includes a light emitting chip has a missing portion in its side walls.

16 Claims, 15 Drawing Sheets

LIGHT EMITTING ELEMENT, LIGHT EMITTING ELEMENT ARRAY, BACKLIGHT UNIT, AND LIQUID CRYSTAL DISPLAY

BACKGROUND OF THE INVENTION

1. Field of the Invention

The present invention relates to a light emitting element, a light emitting element array including of a plurality of light emitting elements, a backlight unit that receives light from such a light emitting element array, and a liquid crystal display provided with the backlight unit.

2. Description of the Related Art

A common thin liquid crystal display like the one in JP-A-2006-64733 is equipped with a side-light type backlight unit having a light guide plate and an LED array (light emitting element array) that shines light on the side edge of the light guide plate.

Such a backlight unit includes an LED array 101 (see FIG. 15, which will be described later) including a row of LEDs 102 shown in FIG. 13 and FIGS. 14A to 14C, for example (FIG. 14A is a plan view of FIG. 13, FIG. 14B is a sectional view taken on the line a-a' of FIG. 14A, and FIG. 14C is a sectional view taken on the line b-b' of FIG. 14A).

The presence of a plurality of LEDs 102 (light emitting elements) offers the advantage of an increase in the amount of light emergent from the backlight unit in proportion to the number of LEDs 102. This increased amount of light increases the brightness of a liquid crystal display panel which leads to an improvement in display quality.

However, in the LED 102 shown in FIG. 13 and FIGS. 14A to 14C, a light emitting chip 121 is enclosed with side walls 132 of a package (housing member) 123. Therefore, a portion of light emitted by the light emitting chip 121 is cut off by the side walls 132. The LED array 101 composed of these LEDs 102 arranged in a line suffers from the following problems as a result of the light being cut off by the side walls 132 of the package 123. The problems will be described by referring to a sectional view of FIG. 15 showing the LED array 101 and the light guide plate 151, as seen from the same cross-sectional direction as in FIG. 14B (in FIG. 15, for convenience' sake, hatching has been omitted).

As shown in FIG. 15, if the space between the light exit surface of the LED 102 and the side edge of the light guide plate 151 is relatively narrow, the light emergent from the LED 102 reaches the side edge of the light guide plate 151 before it spreads across a relatively wide area (see arrow with solid line), and a portion of the light is cut off by the side walls 132 (see arrow with dashed-dotted line). Therefore, less light enters a portion of the side edge of the light guide plate 151 that opposes a space between the LEDs 102 of the LED 101 array (see the black colored portion in FIG. 15). As a result, the side edge of the light guide plate 151 (and hence the backlight unit) suffers variations in the amount of light present in the light guide plate 151, that is, while the portion opposing the LED 102 is relatively bright, the portion opposing the space between the LEDs 2 is relatively dark.

The following are two examples of the measures to address such a problem. Of these two measures, a first measure entails allowing the side edge of the light guide plate 151 to be nearly evenly supplied with light by widening the space between the LED 102 and the side edge of the light guide plate 151 such that the light from the LED 102 spreads across a somewhat wider area (at a wider angle). A second measure entails allowing the side edge of the light guide plate 151 to be nearly evenly supplied with light by a diverging light produced by the side edge of the light guide plate 151 that is carved into the shape of a lens.

However, adopting the first measure results in a reduction in entrance efficiency of light entering the light guide plate 151 due to a wider space between the light exit surface of the LED 102 and the side edge of the light guide plate 151. This leads to a reduction in brightness of the backlight unit. On the other hand, with respect to the second measure, there is a limit on the degree of divergence of light based on the lens shape. As a result, the second measure produces little effect if the space between the LEDs 2 of the LED array 101 is relatively wide. As described above, the first and second measures are not sufficient to eliminate the variations in the amount of light in the backlight unit.

SUMMARY OF THE INVENTION

In view of the conventionally experienced problems described above, preferred embodiments of the present invention provide measures other than the first and second measures. Specifically, the above-described problem is caused by a reduction in the degree of spread of light emergent from the light emitting element as a result of the light being cut off by the side walls of the housing member with which the light emitting chip is surrounded.

Therefore, preferred embodiments of the present invention provide a light emitting element that minimizes the influence of such a reduction. Furthermore, preferred embodiments of the present invention provide a light emitting element array including such a light emitting element, a backlight unit including such a light emitting element array, and a liquid crystal display including such a backlight unit.

According to one preferred embodiment of the present invention, a light emitting element has at least one light emitting chip housed in a housing member having an opening. Here, the housing member has side walls and light passage portions corresponding to a missing portion of the side walls.

As a result, while a portion of the light emitted from the light emitting chip is cut off by the side walls, the remaining light travels to the outside through the light passage portions. Thus, the light emitting element makes it possible to increase a degree of the spread of the emergent light through the presence of light that travels to the outside through the light passage portions.

Preferably, in the light emitting element, a direction in which the side walls are arranged, the direction as defined by the side walls located so as to oppose one another with the light emitting chip interposed between the side walls intersects with a direction in which the light passage portions are arranged, the direction as defined by the light passage portions located so as to oppose one another with the light emitting chip interposed between the light passage portions.

This allows a first direction in which the light is cut off by the side walls to intersect with a second direction in which the light travels through the light passage portions. Thus, this light emitting element can direct a relatively large amount of light in a desired second direction. That is, the light emitting element can direct the spread of light emergent therefrom in a desired second direction.

Preferably, the light emitting element includes a sealing member that allows light to pass there through, that covers the light emitting chip, and that has a shape that tapers down from the light emitting chip to the opening of the housing member. Specifically, it is preferable that the sealing member have a tapered shape as a result of a plane of the sealing member, the plane opposing a corresponding one of the light passage portions, being sloped.

This allows the light that travels obliquely upward (the light that travels in an elevation angle direction) from the light emitting chip, that is, the light that travels from the light emitting chip toward the opening of the sealing member at various elevation angles, to shine on the sloped side surface of the sealing member, then to be refracted at that side surface, and then to pass therethrough to the outside. In this case, since the side surface of the sealing member opposes the light passage portion, the light that is refracted and then travels to the outside has a tendency to spread in a desired second direction. Thus, the light emitting element can more easily direct the spread of light emergent therefrom in a desired second direction.

Preferably, in the light emitting element, the inner surfaces of the side walls, the inner surfaces receiving light from the light emitting chip, are reflecting surfaces, because this makes it possible to reflect the light shone on the side walls toward the opening of the sealing member or the light passage portions.

Incidentally, the number of light emitting chips mounted on the light emitting element is not limited. However, if there are a plurality of light emitting chips, it is preferable that the light emitting chips be arranged in a line. This structure helps the light emitting element to produce not only an increased amount of light, but also linear light. Thus, if this light emitting element is disposed, for example, at the longer side edge of the light guide plate, the light reaches every portion in the longer-side direction of the side edge.

Preferably, in such a light emitting element having a plurality of light emitting chips mounted thereon, a direction in which the side walls are arranged, the direction as defined by the side walls located so as to oppose one another with a row of the light emitting chips interposed between the side walls intersects with a direction in which the light passage portions are arranged, the direction as defined by the light passage portions located with the row of the light emitting chips sandwiched from both ends, such that while a relatively large amount of light is directed in a desired one direction (second direction), light is not directed in a specific direction (a direction other than the desired second direction, i.e., a first direction).

Arranging a plurality of light emitting elements described above provides a light emitting element array. Preferably, in such a light emitting element array, if the light emitting elements are arranged in a line, the light passage portions of the light emitting elements adjacent to one another oppose one another, and the light passage portions are arranged in a row.

This allows the light passing through the light passage portions of the light emitting elements to be connected to one another, making it possible to achieve a light emitting element array that produces continuous linear light. Thus, if this light emitting element array is disposed, for example, at the longer side edge of the light guide plate, the light reaches every portion in the longer-side direction of the side edge.

Preferably, in a light emitting element array including a plurality of light emitting elements, each having at least one light emitting chip housed in a housing member having an opening, in each light emitting element, at least one light emitting chip is housed in a housing member having an opening, and the housing member has side walls and light passage portions corresponding to a missing portion of the side walls.

Such a light emitting element array includes a light emitting element that emits light having a higher degree of spread.

Thus, the light emitting element array itself can emit light having a higher degree of spread.

Preferably, in the light emitting element array, a direction in which the side walls are arranged, the direction as defined by the side walls arranged so as to oppose one another with the light emitting chip interposed between the side walls intersects with a direction in which the light passage portions are arranged, the direction as defined by the light passage portions located so as to oppose one another with the light emitting chip interposed between the light passage portions.

This allows the light emitting element array to direct the spread of light emergent there from in a single desired direction.

In particular, it is preferable that, if the light emitting elements are arranged in a line in the light emitting element array, the light passage portions of the light emitting elements adjacent to one another oppose one another, and the light passage portions are arranged in a line.

This allows the light passing through the light passage portions of the light emitting elements to be connected to one another, making it possible to achieve a light emitting element array that produces continuous linear light. Thus, if this light emitting element array is disposed, for example, at the longer side edge of the light guide plate, the light reaches every portion in the longer-side direction of the side edge.

Preferably, the light emitting element of the light emitting element array includes a sealing member that allows light to pass there through, that covers the light emitting chip, and that has a shape that tapers down from the light emitting chip to the opening of the housing member. In particular, it is preferable that the sealing member have a tapered shape as a result of a plane of the sealing member being sloped, and the plane opposing a corresponding one of the light passage portions.

This allows the light that travels to the outside through the side surface of the sealing member, the side surface opposing the light passage portion, to easily spread in a desired second direction. This helps achieve a light emitting element array that can more easily direct the spread of light emergent therefrom in a single desired direction.

Preferably, in the light emitting element array, the inner surfaces of the side walls, the inner surfaces receiving light from the light emitting chip, are reflecting surfaces, because this makes it possible to reflect the light shone on the side walls toward the opening of the sealing member.

According to another preferred embodiment of the present invention, a backlight unit is provided with the light emitting element array described above and a light guide plate receiving light from the light emitting element array and directing the light to the outside. According to still another preferred embodiment of the present invention, a liquid crystal display is provided with a liquid crystal display panel receiving light that is directed from such a backlight unit.

According to preferred embodiments of the present invention, a portion of light from the light emitting chip travels to the outside through the light passage portion. This helps increase the degree of spread of light emergent from the light emitting element.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

Figure 1:
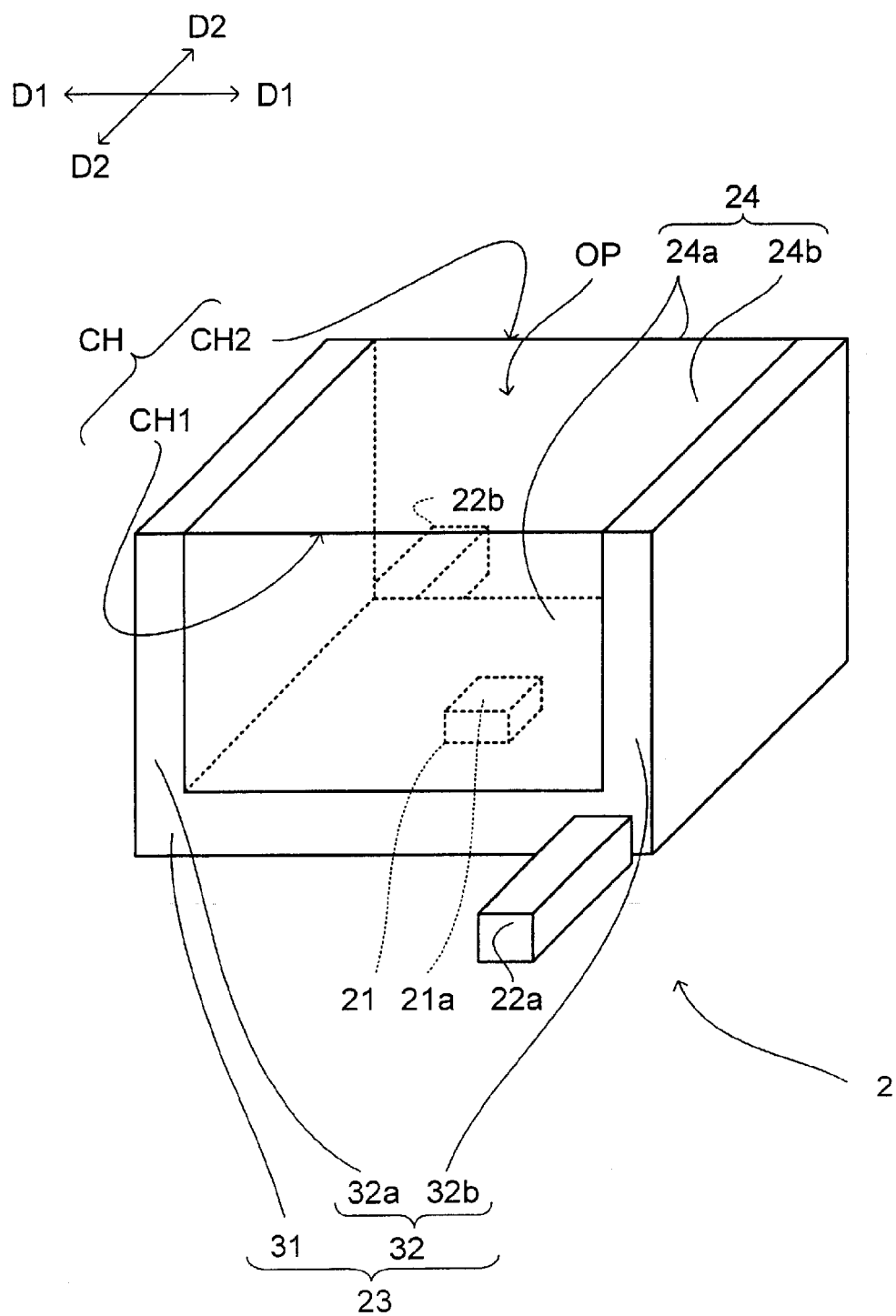
FIG. 1 is a perspective view of an LED according to a preferred embodiment of the present invention.

A first preferred embodiment of the present invention will be described with reference to the drawings. For the sake of clarity, component numbers and hatching may be omitted in some of the drawings. In such a case, other drawings will be referred to. In the drawings, a black circle indicates a direction that is perpendicular to the plane of the page.

Figure 12:
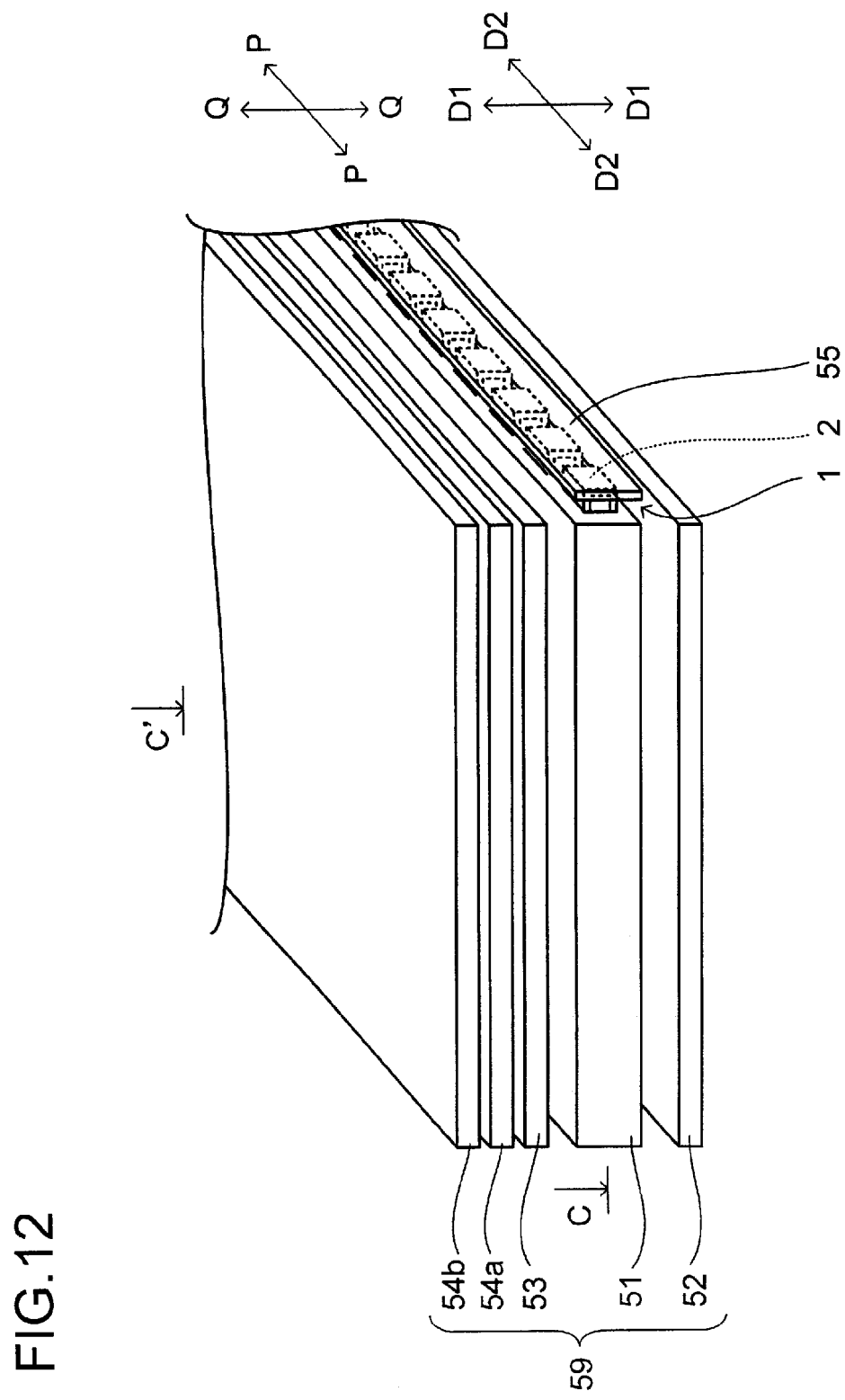
FIG. 12 is a perspective view of a backlight unit according to a preferred embodiment of the present invention.
Figure 13:
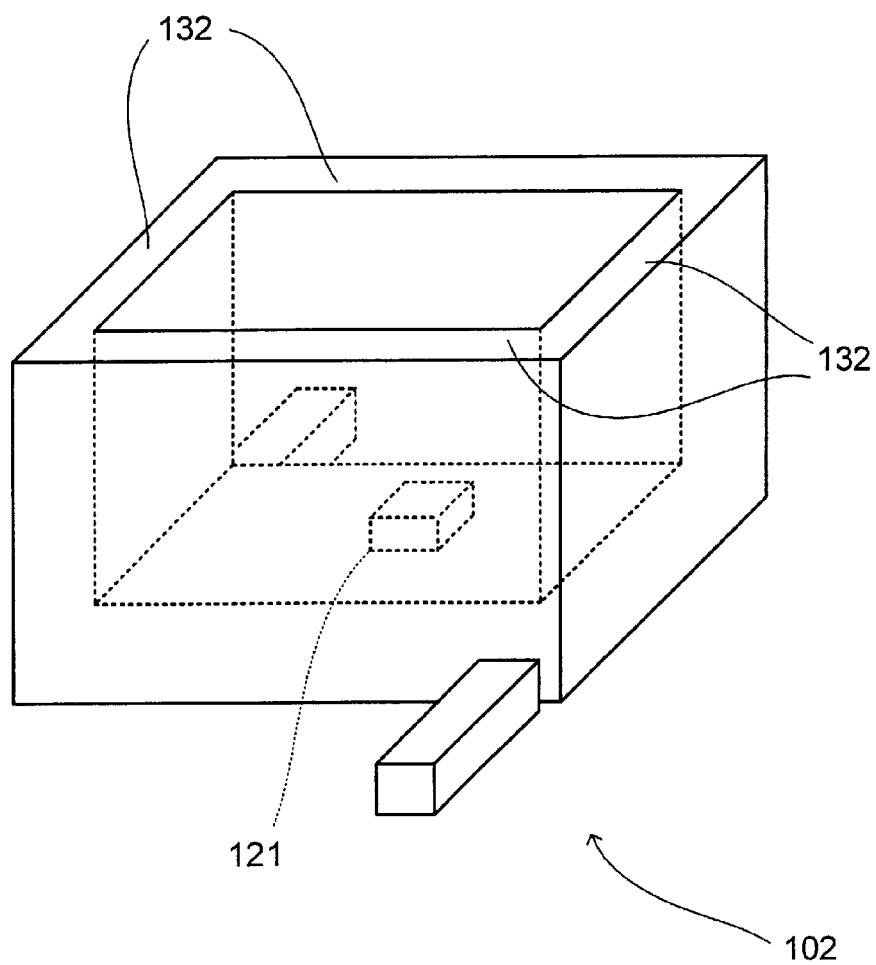
FIG. 13 is a perspective view of a conventional LED.
Figure 14A:
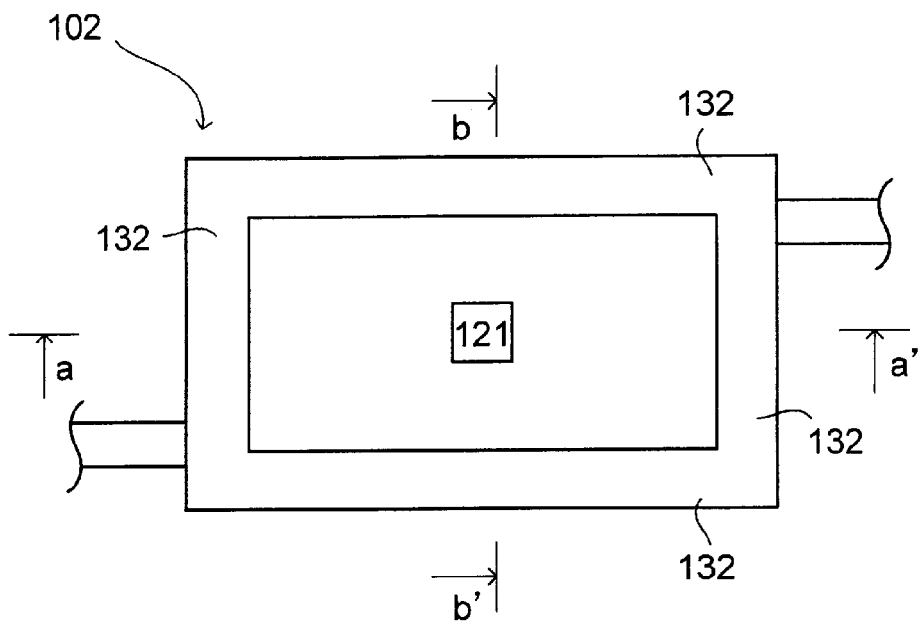
FIG. 14A is a plan view of an LED shown in FIG. 13.
Figure 14B:
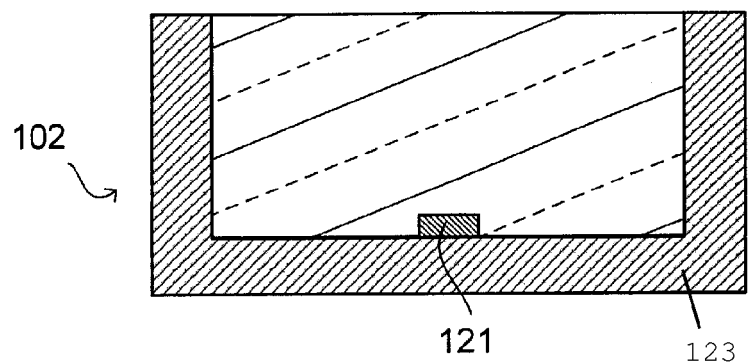
FIG. 14B is a sectional view taken on the line a-a' of FIG. 11A.
Figure 14C:
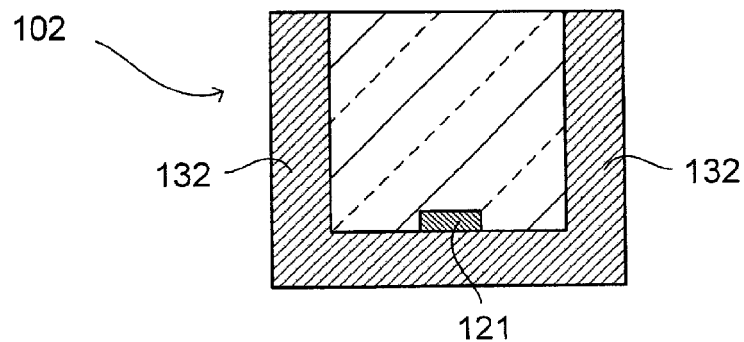
FIG. 14C is a sectional view taken on the line b-b' of FIG. 11A.
Figure 15:
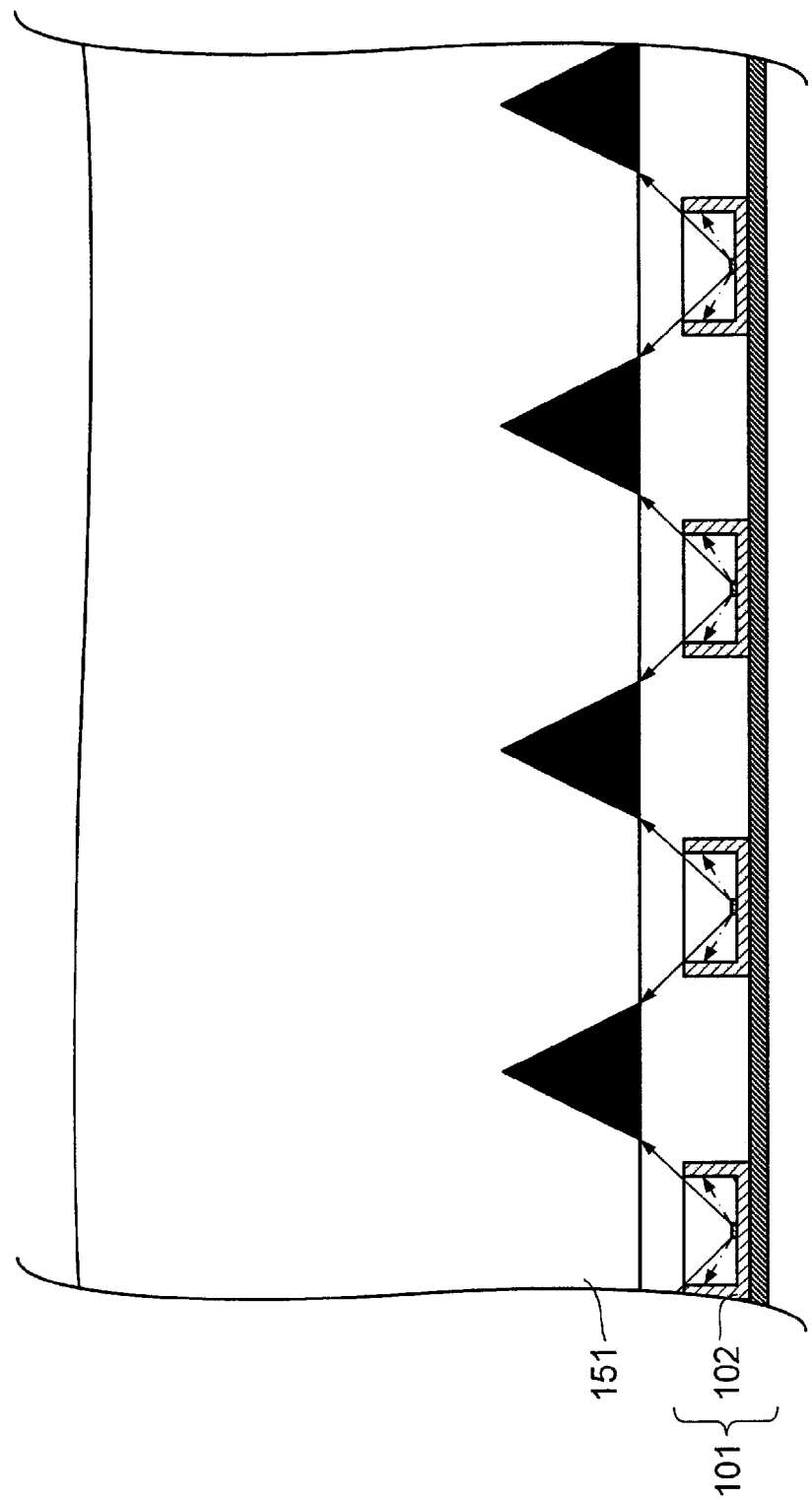
FIG. 15 is a sectional view of a conventional backlight unit.

In general, a liquid crystal display includes a liquid crystal display element panel and a backlight unit that directs light to the liquid crystal display panel. FIG. 12 shows a backlight unit (sidelight type backlight unit) 59.

The backlight unit 59 shines light toward the liquid crystal display panel. The backlight unit 59 includes an LED (light emitting diode) array 1, a light guide plate 51, a reflecting sheet 52, a diffusing sheet 53, and lens sheets 54a and 54b.

The LED array 1 emits light as a light source, and the light guide plate 51 converts dot-like light of the LEDs 2 of the LED array 1 into planar light. The reflecting sheet 52 reflects light from the LED array 1 and light propagating through the light guide plate 51 toward the liquid crystal display panel without any leakage of light.

Moreover, the diffusing sheet 53 diffuses light from the light guide plate 51, such that the light is distributed throughout the liquid crystal display panel. The lens sheets 54a and 54b deflect radiation characteristics of the light incident on the liquid crystal display panel (condense the light), so as to enhance the luminous brightness per unit area of the liquid crystal display panel.

Here, with reference to FIG. 1, FIGS. 2A to 2C, and FIG. 3, the LED array 1 and an LED 2 mounted thereon will be described. As shown in FIG. 3, the LED array 1 includes a base substrate 55 and a plurality of LEDs 2 arranged in a line on the base substrate 55. A perspective view of the LED 2 is shown in FIG. 1. Arrow P shown in the figures (for example, FIG. 3) indicates an array direction P in which the LEDs 2 are arranged, and arrow Q indicates an in-planar direction of the base substrate 55, the in-planar direction perpendicular to the array direction P (arrows D1 and D2 shown in these figures will be described later).

As shown in FIG. 1, the LED 2 includes a light emitting chip 21 that emits light, terminals (an anode 22a and a cathode 22b) serving as a passage of current flowing through the light emitting chip 21, a package (housing member) 23 that houses the light emitting chip 21, and a sealing member 24 that is made, for example, of resin (such as transparent silicon) and covers the light emitting chip 21.

Figure 2A:
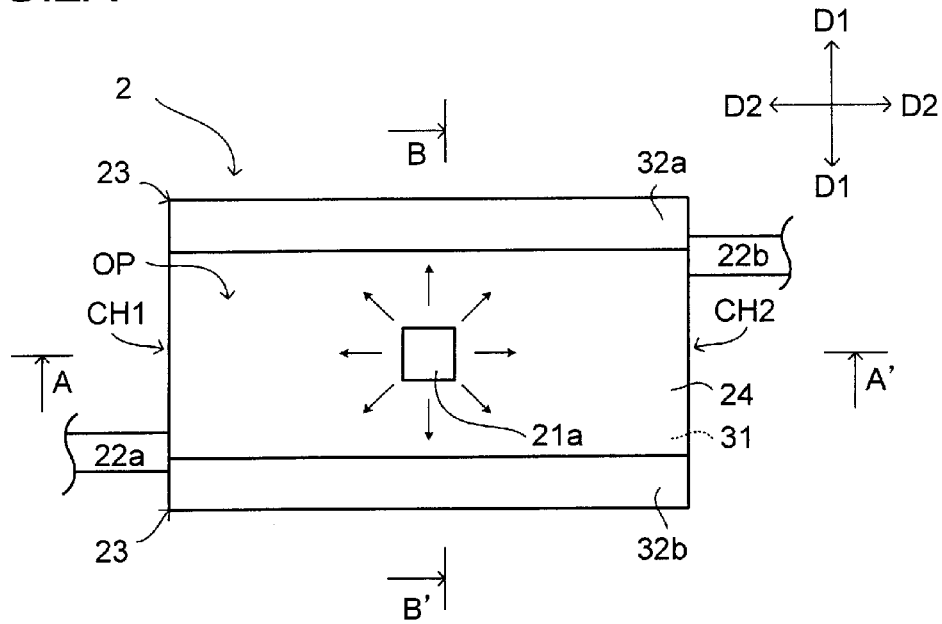
FIG. 2A is a plan view of FIG. 1.
Figure 2B:
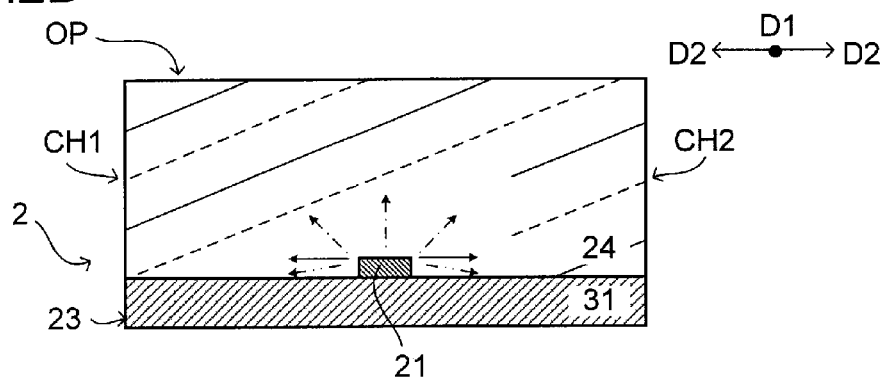
FIG. 2B is a sectional view taken on the line A-A' of FIG. 2A.
Figure 2C:
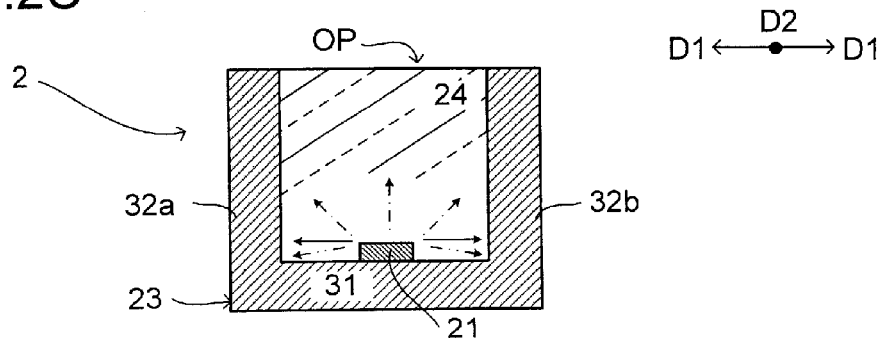
FIG. 2C is a sectional view taken on the line B-B' of FIG. 2A.
Figure 3:
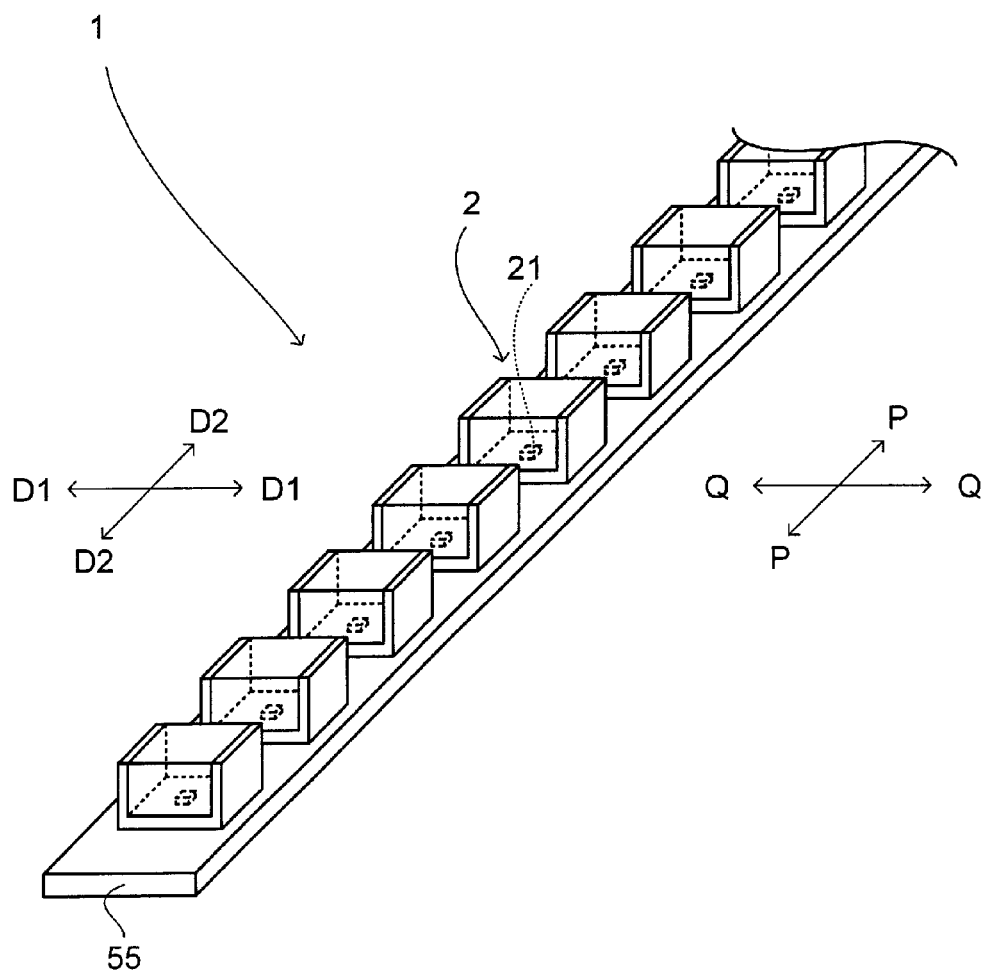
FIG. 3 is a perspective view of an LED array according to a preferred embodiment of the present invention.

FIG. 2A shows the LED 2 as seen in a plan view, FIG. 2B shows a cross-section taken on the line A-A' of FIG. 2A, and FIG. 2C shows a cross-section taken on the line B-B' of FIG. 2A. As shown in FIGS. 2A to 2C, the LED 2 includes one light emitting chip 21. The light emitting chip 21 is held by the package 23 which has an opening OP in a top portion thereof.

The light emitting chip 21 is located near the center of the surface of the bottom 31, and emits light that spreads spherically around the light emitting chip 21. Examples of such light are light (see arrows with solid line in FIGS. 2A to 2C) that spreads radially around the light emitting chip 21 itself in the azimuth direction with reference to the light emitting chip 21, and light (see arrows with dashed-dotted line (elevation angle direction) and arrows with dashed-two dotted line (depression angle direction) in FIGS. 2B and 2C) that spreads radially around the light emitting chip 21 itself in the elevation angle direction and the depression angle direction with respect to the light emitting chip 21.

It is to be noted that the manner in which the light emitting chip 21 is held is not limited. For example, the light emitting chip 21 may be attached to the bottom 31 of the package 23 (see FIG. 1), or may be attached to one of the side walls 32 (32a and 32b) that stand on the bottom 31 (it is preferable that a light emitting surface 21a of the light emitting chip 21 oppose the opening OP).

However, the side walls 32 of the package 23 cut off portion of the light emergent from the light emitting chip 21 (note that some of the light is reflected on the side wall 32, and then travels to the outside through the opening OP). It is for this reason that the side walls 32 are structured so as not to lie in the direction in which one wants the light to travel. An example of such a structure is the shape of the package 23 shown in FIG. 1 and FIGS. 2A to 2C described above.

As shown in these figures, the package 23 includes a plate-like bottom 31 and plate-like side walls 32 (32a and 32b) that stand on the bottom 31 with the bottom 31 arranged between them. Note that the side walls 32 are not arranged to surround the entire edge of the bottom 31; they are provided in a portion of the edge of the bottom 31. Therefore, it can be said that the package 23 is arranged in a shape having a missing portion in the side walls 32, that is, in the box shape having a missing portion in the side walls 32 (in other words, in the shape from which portion of the side walls 32 is removed).

When the light emitting chip 21 emits light that spreads spherically around the light emitting chip 21 itself in the package 23, while a portion of the light is cut off by the side walls 32, the light (remaining light) that has not been cut off travels to the outside through clearances CH (CH1 and CH2) that correspond to missing portions of the side walls 32, and through the opening OP. This means that the light that would be cut off by the side walls if an LED is provided with the light emitting chip surrounded by the side walls travels to the outside through the clearances CH. Thus, the spreading degree of the light emergent from the LED 2 is increased by the amount of light that has traveled to the outside.

Moreover, a direction (which is referred to as a "first direction D1") in which the side walls 32a and 32b are arranged, the direction as defined by the side walls 32a and 32b located so as to oppose one another with the light emitting chip 21 interposed between them intersects (for example, at right angles) with another direction (which is referred to as a "second direction D2") in which the clearances CH1 and CH2 are arranged, the direction as defined by the clearances CH1 and CH2 located so as to oppose one another with the light emitting chip 21 interposed between them.

Figure 4A:
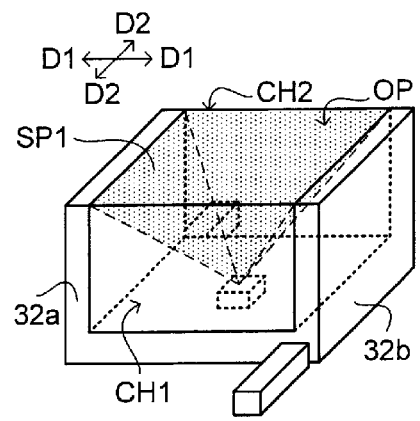
FIG. 4A is a perspective view showing one space (SP1) of the five spaces into which the housing space of the package is divided according to a preferred embodiment of the present invention.
Figure 4D:
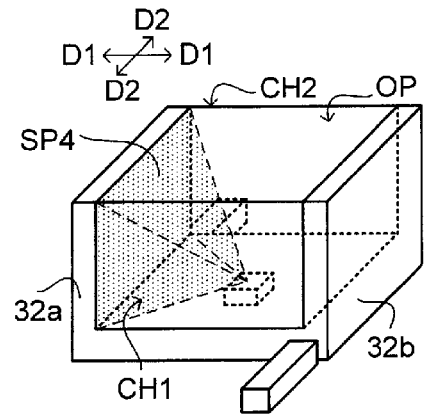
FIG. 4D is a perspective view showing one space (SP4) of the five spaces into which the housing space of the package is divided according to a preferred embodiment of the present invention.
Figure 4B:
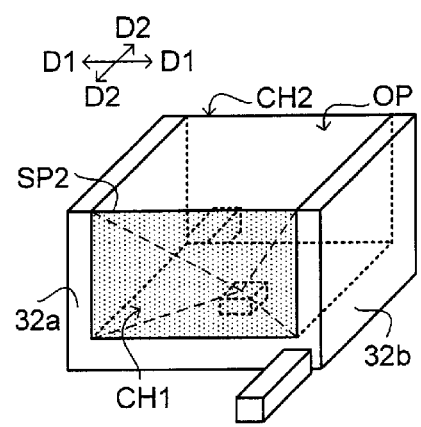
FIG. 4B is a perspective view showing one space (SP2) of the five spaces into which the housing space of the package is divided according to a preferred embodiment of the present invention.
Figure 4E:
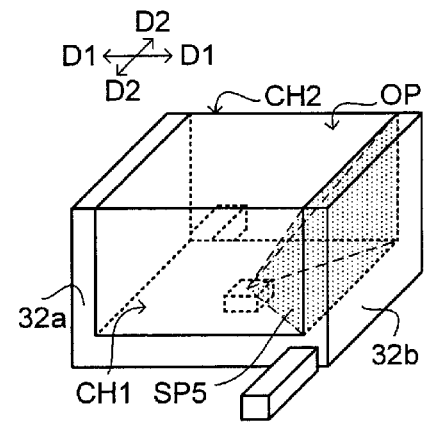
FIG. 4E is a perspective view showing one space (SP5) of the five spaces into which the housing space of the package is divided according to a preferred embodiment of the present invention.
Figure 4C:
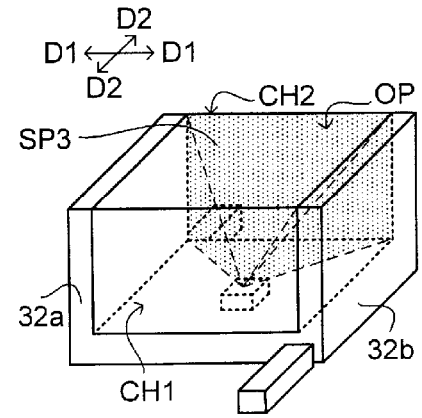
FIG. 4C is a perspective view showing one space (SP3) of the five spaces into which the housing space of the package is divided according to a preferred embodiment of the present invention.

Therefore, as shown in FIGS. 4A to 4E, the housing space of the package 23 can be divided into five spaces. Specifically, there are a first space SP1 that is shown in FIG. 4A and is defined by the lines connecting the light emitting chip 21 with the corners of the opening OP of the package 23, a second space SP2 that is shown in FIG. 4B and is defined by the lines connecting the light emitting chip 21 with the corners of the clearance CH1, a third space SP3 that is shown in FIG. 4C and is defined by the lines connecting the light emitting chip 21 with the corners of the clearance CH2, a fourth space SP4 that is shown in FIG. 4D and is defined by the lines connecting the light emitting chip 21 with the corners of the inner surface of the side wall 32a, and a fifth space SP5 that is shown in FIG. 4E and is defined by the lines connecting the light emitting chip 21 with the corners of the inner surface of the side wall 32b. The first space SP1 to the third space SP3 are arranged in the second direction D2, and the fourth space SP4 and the fifth space SP5 are arranged in the first direction D1.

In these five spaces (SP1 to SP5), if the light from the light emitting chip 21 passes through the first space SP1 to the third space SP3, it travels to the outside through the opening OP and the clearances CH1 and CH2; on the other hand, if it passes through the fourth space SP4 and the fifth space SP5, it is cut off by the side walls 32a and 32b.

Thus, while the light travels in the second direction D2 in which the clearances CH1 and CH2 are arranged, it does not travel in the first direction D1 in which the side walls 32a and 32b are arranged. That is, while the package 23 having the clearances CH1 and CH2 can direct a relatively large amount of light in a desired one direction (second direction D2), it cannot direct the light in another specific direction (a direction other than the desired one direction; for example, the first direction D1).

Figure 5:
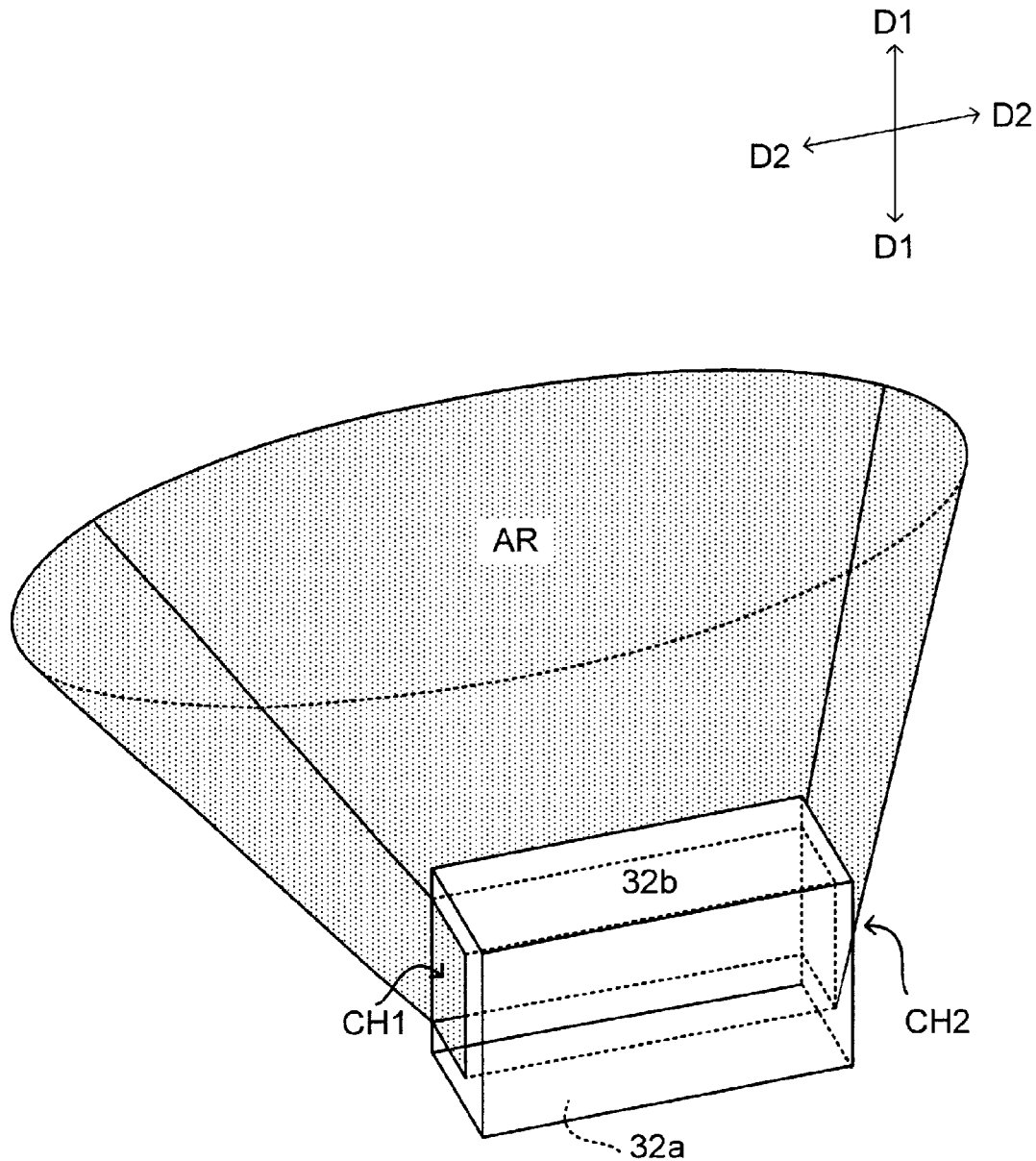
FIG. 5 is a perspective view showing light emergent from the LED according to a preferred embodiment of the present invention.

As a result, as shown in FIG. 5, the area AR shone by the light emergent from the LED 2 is longer in the second direction D2 and is shorter in the first direction D1. That is, the LED 2 emits light (wide angle light) that spreads in a desired one direction.

Figure 6:
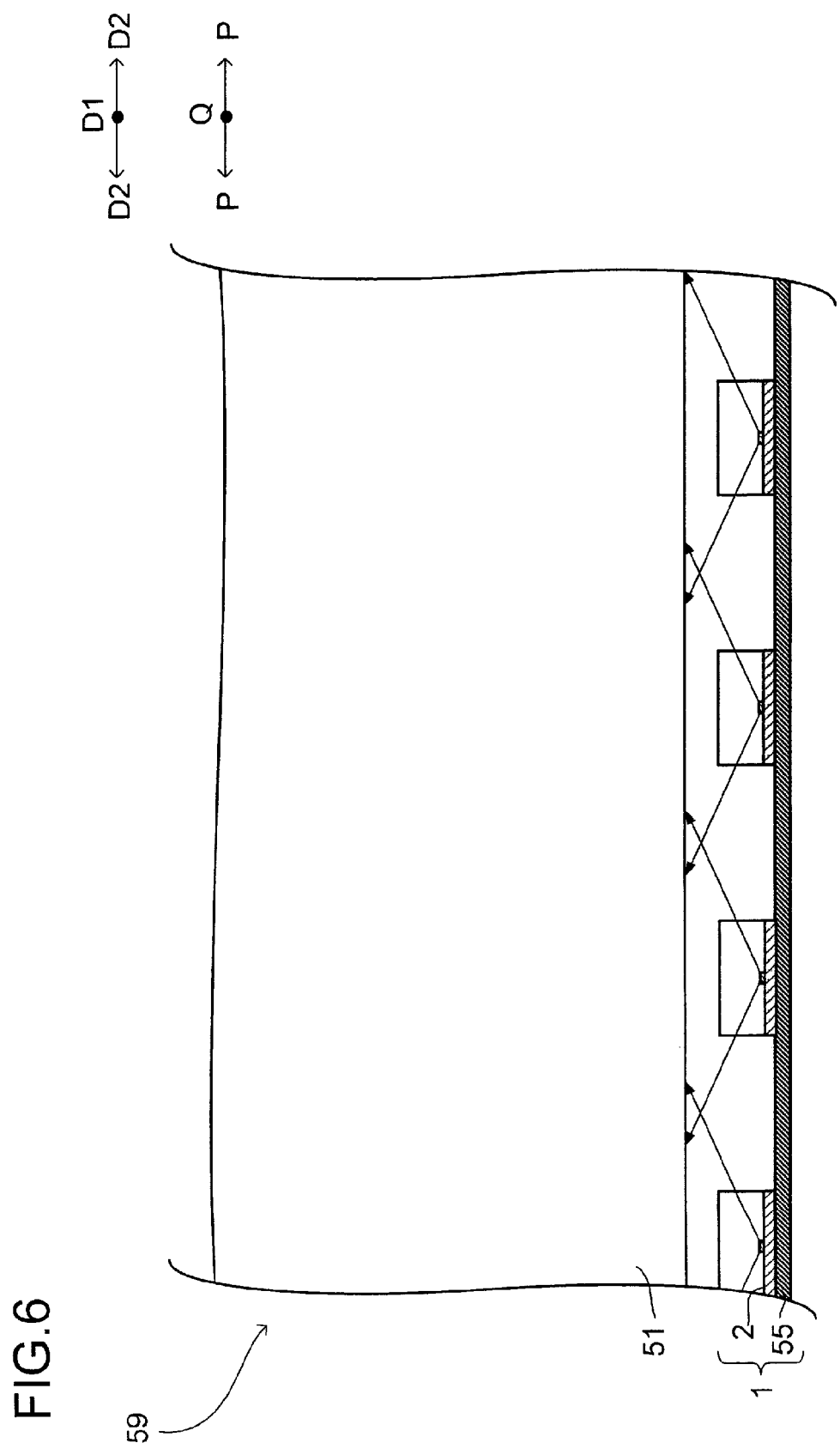
FIG. 6 is a sectional view taken on the line C-C' of a backlight unit according to a preferred embodiment of the present invention that is shown in FIG. 11.

For example, in a case where the LEDs 2 are arranged in a row in the longer-side direction of a side edge of the light guide plate 51 as shown in FIG. 6 (a sectional view taken on the line C-C' of FIG. 12), it is preferable that the longer-side direction coincides with the second direction D2 of the LED 2, because this makes the light travel in the longer-side direction of the side edge of the light guide plate 51.

In addition, it is also preferable that the clearances CH of the LEDs 2 adjacent to one another on the LED array 1 be arranged in a line with the clearance CH of one LED 2 opposing that of the other LED 2. This allows a plurality of clearances CH to be arranged in the second direction D2, and, if the second direction D2 coincides with the longer-side direction of the side edge of the light guide plate 51, the light reaches almost all the portions in the longer-side direction.

On the other hand, the side edge of the light guide plate 51 is shorter in the thickness direction than in the longer-side direction. As a result, even when the amount of light traveling in the thickness direction (shorter-side direction) is relatively small, the entire area of the side edge of the light guide plate 51 in the thickness direction is sufficiently irradiated with the light. On the other hand, if excess light travels in the thickness direction, light that does not enter the light guide plate 51 (leakage light) increases.

Thus, as shown in FIG. 12, it is preferable that the thickness direction of the light guide plate 51 coincides with the first direction D1. This is because it is then possible to cut off the light traveling in the thickness direction by the side walls 32a and 32b, and thereby reduce leakage light.

However, it is preferable that the inner surfaces of the side walls 32 of the package 23, the inner surfaces receiving the light from the light emitting chip 21, be reflecting surfaces. This allows the light to be reflected on the side walls 32, such that the light travels toward the opening OP or the clearances CH of the package 23, and enters the light guide plate 51 efficiently.

Figure 7:
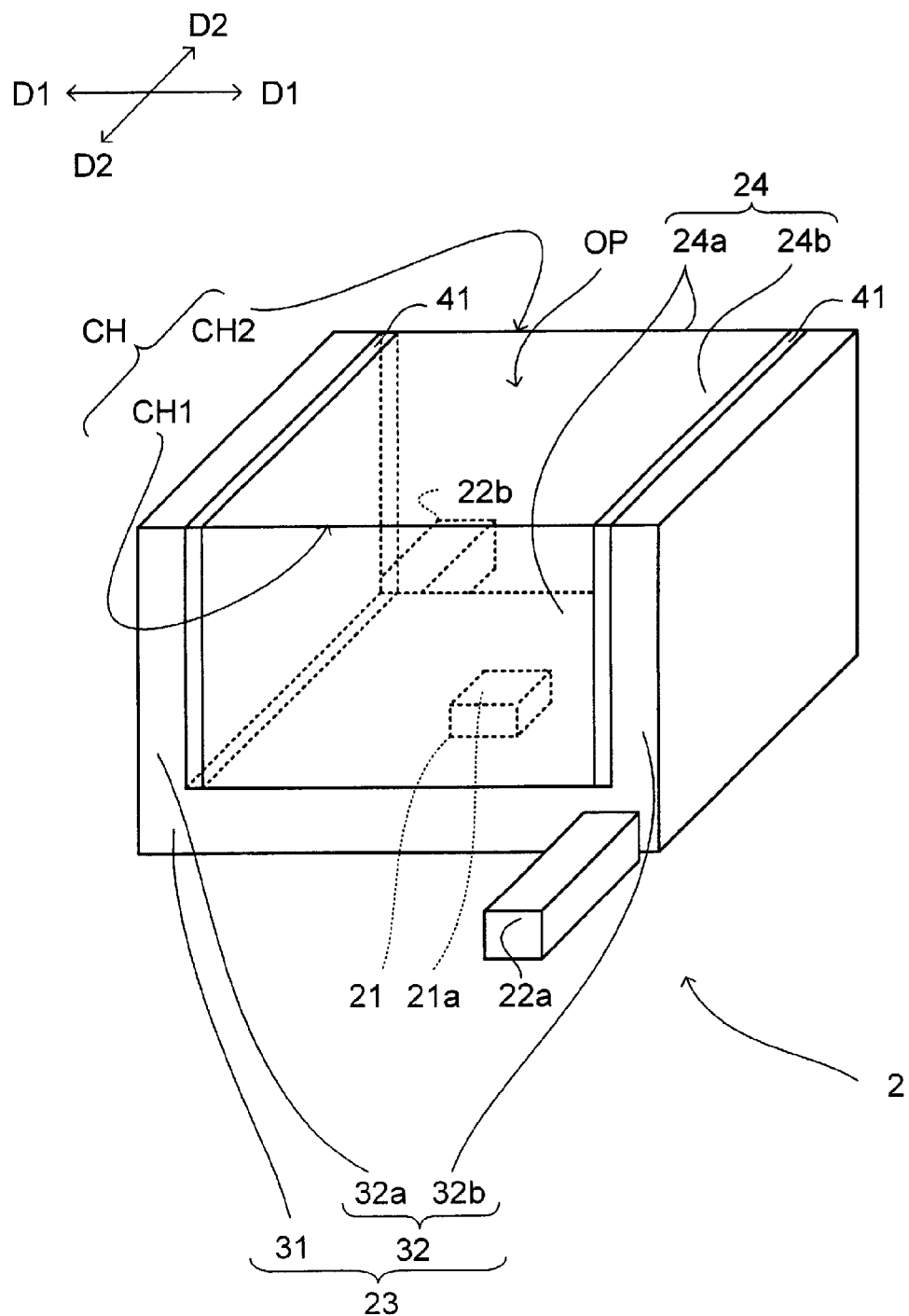
FIG. 7 is a perspective view of an LED according to a preferred embodiment of the present invention and provided with a reflective material.

The reflecting surfaces may be provided on the inner surfaces of the side walls 32 of the package 23 by attaching a reflective material 41, such as a metal, thereto (see FIG. 7). It is also possible to make the inner surfaces of the side walls 32 themselves serve as the reflecting surfaces by producing the package 23 from, for example, a resin (such as a heat-resistant polymer or polyphthalamide (PPA)) having a reflection function.

Other Preferred Embodiments

It is to be understood that the present invention is not limited to the preferred embodiment described above, and various modifications are possible within the scope of the invention.

For example, the missing portion in the side walls 32 is not limited to the clearance CH. For example, though not illustrated, it may be a hole or a notch (cleft) formed in the side walls 32. In a case where the missing portion is a notch, it is preferable that the notch be formed continuously from the opening OP to the bottom 31 of the package 23.

Moreover, the shape of the sealing member 24 of the LED 2 is not limited to a rectangular parallelepiped as shown in FIG. 1. The sealing member 24 may have a shape (tapered shape) that tapers down from the light emitting chip 21 toward the opening OP of the package 23. An example of such a sealing member 24 is the sealing member 24 shown in FIG. 8A and FIG. 8B (a sectional view taken on the line D-D' of FIG. 8A).

That is, an example of such a sealing member 24 is a tapered sealing member 24 in which portion of the side surfaces 24a thereof that oppose the clearances CH1 and CH2 of the package 23 is sloped (in such a way that the surface of each side surface 24a in that portion is exposed toward the opening OP), such that the sloped side surface (sloped surface 24a) provides an obtuse angle $\phi$ with the top surface 24b of the sealing member 24 (the angle $\phi$ is an angle formed by the surfaces inside the sealing member 24).

This allows the light that passes through the sloped surface 24a to the outside to travel in a direction closer to the second direction D2 for the following reason, which will be described by using light path diagrams shown in FIGS. 9A and 9B. In both figures, light that travels at the same elevation angle ($\delta$) from the light emitting chip 21 is used as an example.

Figure 9A:
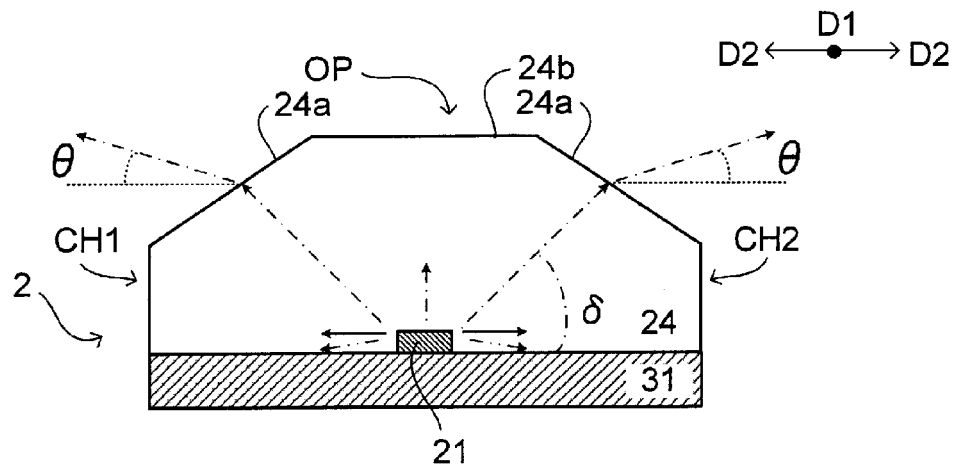
FIG. 9A is a diagram showing a light path in the LED according to a preferred embodiment of the present invention provided with a tapered sealing member.

In the case of the tapered sealing member 24 shown in FIG. 9A, the light that travels at the elevation angle ($\delta$) is incident on the sloped face 24a of the sealing member 24. In this case, thanks to the angle of slope of the sloped surface 24a, the incidence angle of light seldom becomes greater than the critical angle. As a result, the light is refracted at the sloped face 24a and passes through it to the outside.

Figure 9B:
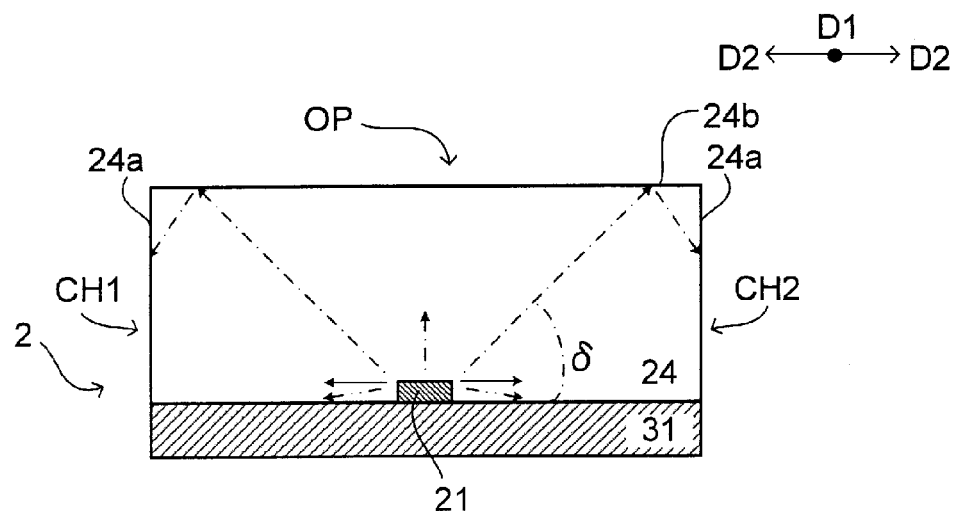
FIG. 9B is a diagram showing a light path in the LED according to a preferred embodiment of the present invention being provided with a rectangular parallelepiped sealing member.

On the other hand, in the case of the rectangular parallelepiped sealing member 24 shown in FIG. 9B, the light that travels at the elevation angle ($\delta$) is incident on the top surface 24b of the sealing member 24. In this case, if the top surface 24b is parallel or substantially parallel to the light emitting surface 21a of the light emitting chip 21, the incidence angle of light easily becomes greater than the critical angle. As a result, the light is totally reflected on the top surface 24b and travels toward the inner portion of the sealing member 24.

As described above, if the sloped surface 24a is provided in the package 24, the sloped surface 24a makes it easy for the light from the light emitting chip 21 to travel to the outside. In particular, since the side surface 24a of the sealing member 24 opposes the clearance CH, the light traveling to the outside easily spreads in the second direction D2. This helps the LED 2 to direct the spread of light emergent therefrom in the second direction D2.

If the sloped surface 24a (more specifically, the angle of slope of the sloped surface 24a) is set so that the angle of inclination of light emergent from the sloped surface 24a relative to the horizontal plane (the angle of emergence $\theta$ of the emergent light) is relatively small, as shown in FIG. 9A, the light that travels in a direction closer to the second direction D2 increases.

Figure 8A:
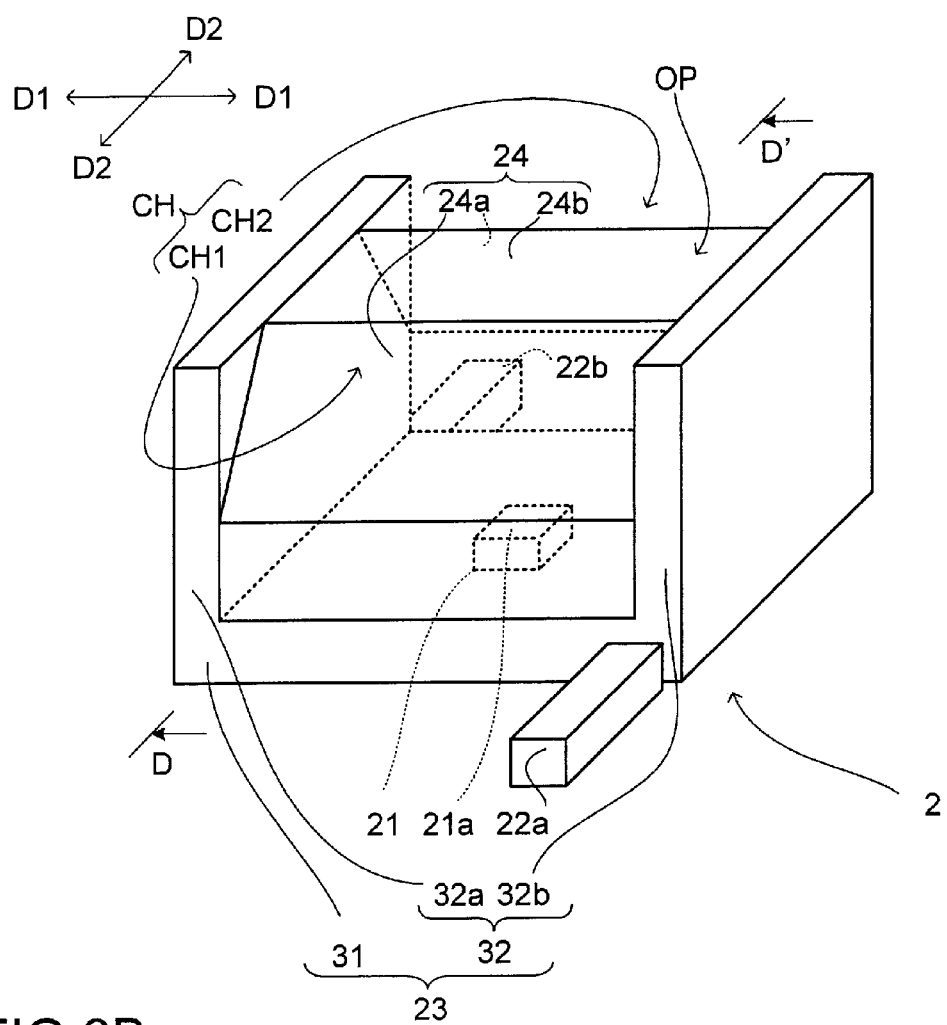
FIG. 8A is a perspective view of an LED according to a preferred embodiment of the present invention and provided with a tapered sealing member.
Figure 8B:
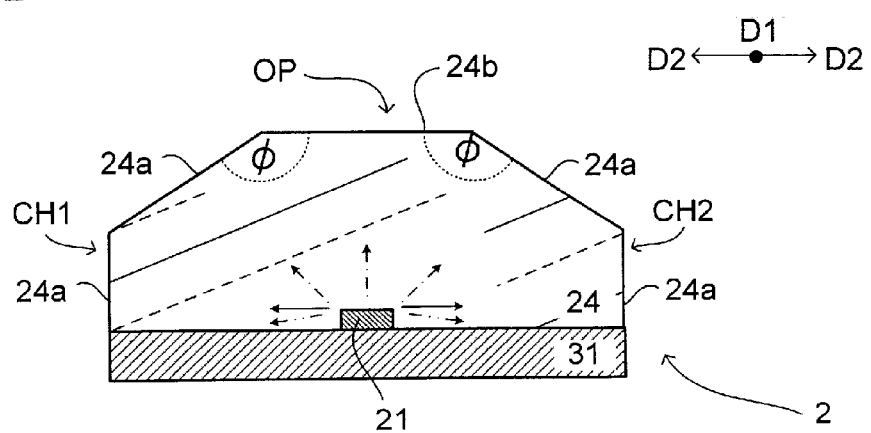
FIG. 8B is a sectional view taken on the line D-D' of FIG. 8A.

Incidentally, the tapered shape of the sealing member 24 is not limited to the shape shown in FIGS. 8A and 8B. For example, the sealing member 24 may have a shape that tapers down in a direction in which the light from the light emitting chip 21 travels by sloping the entire portion of the side surface 24a of the sealing member 24. Moreover, the sloped surface 24a is not limited to a flat surface, and it may be instead a curved surface (such as a free surface). In such a case, by appropriately setting the curvature in portion of the plane, the refraction direction of light is adjusted such that a large amount of light is focused in a specific direction.

Figure 10:
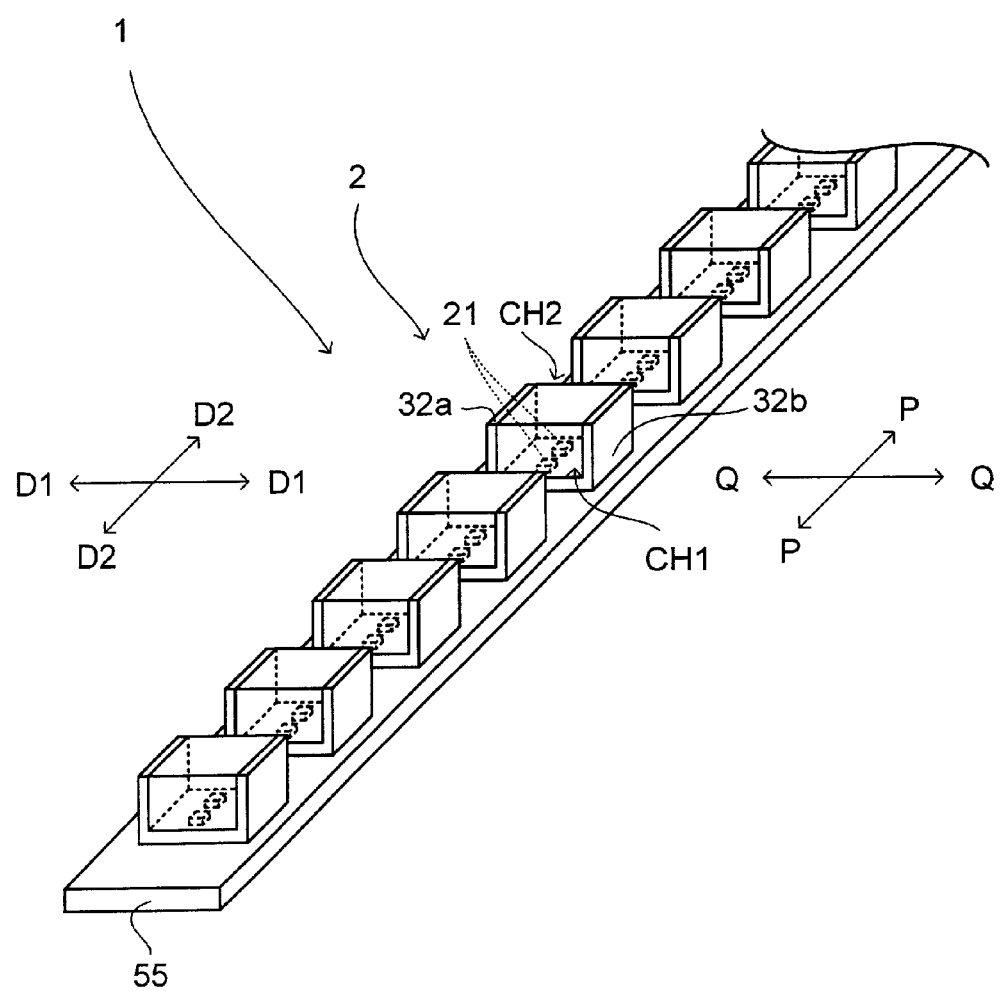
FIG. 10 is a perspective view of an LED array according to a preferred embodiment of the present invention that is different from that of FIG. 3.

Moreover, as shown in FIG. 10, in the LED array 1 having a line arrangement, a plurality of light emitting chips 21 may be provided in one LED 2. The reason is as follows. Even with this type of LED 2, as long as the package 23 is provided with the side walls 32a and 32b and the clearances CH1 and CH2, it is possible to cut off a portion of the light from the light emitting chip 21 by the side walls 32, and direct the remaining light (the remainder of the light) to the outside through the clearances CH.

Figure 11A:
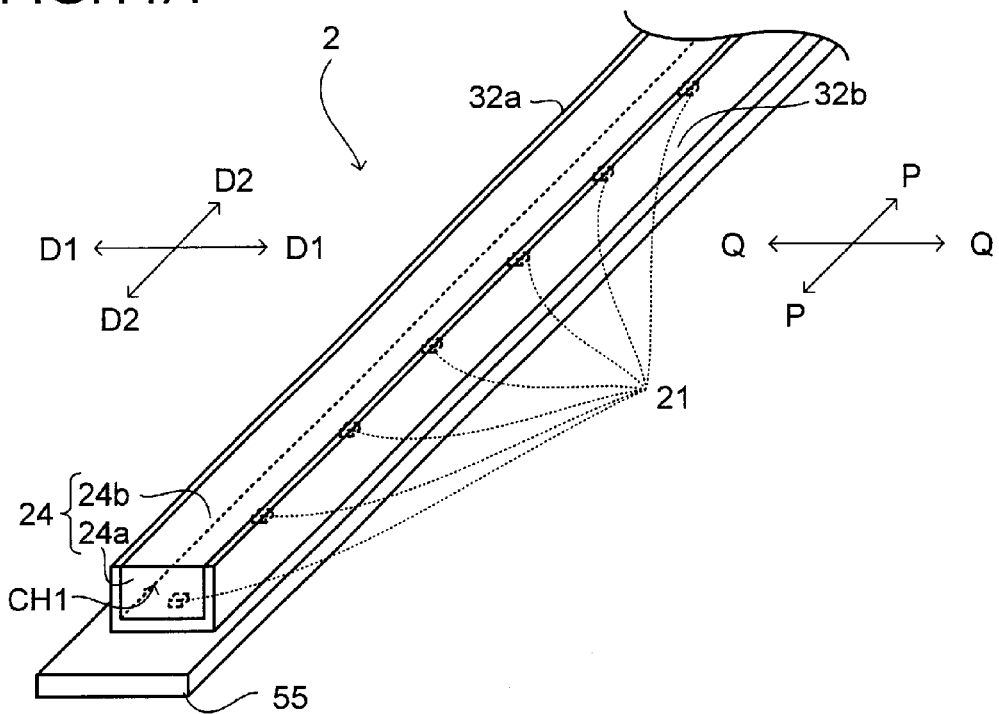
FIG. 11A is a perspective view of an LED according to a preferred embodiment of the present invention that is different from that of FIG. 1.

Furthermore, the light source provided at the side edge of the light guide plate 51 is not limited to the LED array 1; for example, as shown in FIG. 11A, it may be an LED 2 having a plurality of light emitting chips 21. That is, it may be an LED 2 in which the light emitting chips 21 are arranged in a line (such an LED 2 may be referred to as an LED array 1, because the plurality of light emitting chips 21 are arranged in an array).

The light emitting chip 21 described above is not limited to the one having a specific emission spectrum. That is, a plurality of light emitting chips 21 having different emission spectra (for example, emission spectra of red, blue, and green) may be mounted on the LED 2 or the LED array 1.

In the LED 2 described above, it is preferable that a direction in which the side walls 32a and 32b are arranged, the direction as defined by the side walls 32a and 32b located so as to oppose one another with the row of the light emitting chips 21 interposed between them intersect with a direction in which the clearances CH1 and CH2 are arranged, the direction as defined by the clearances CH1 and CH2 located with the row of the light emitting chips 21 sandwiched from both ends.

This allows the LED 2 to make the light travel in the second direction D2 which is the direction in which the clearances CH1 and CH2 are arranged, and not to make the light travel in the first direction D1 which is the direction in which the side walls 32a and 32b are arranged. As a result, the LED 2 emits light that spreads in a single desired direction. Therefore, if the longer-side direction of the side edge of the light guide plate 51 coincides with the second direction D2 in which the light emitting chips 21 are arranged, light is incident on almost the entire area of the side edge of the light guide plate 51 along the longer-side direction. Moreover, if the thickness direction of the side edge of the light guide plate 51 coincides with the direction (first direction D1) in which the side walls are arranged, light that does not enter the light guide plate 51 (leakage light) decreases.

Figure 11B:
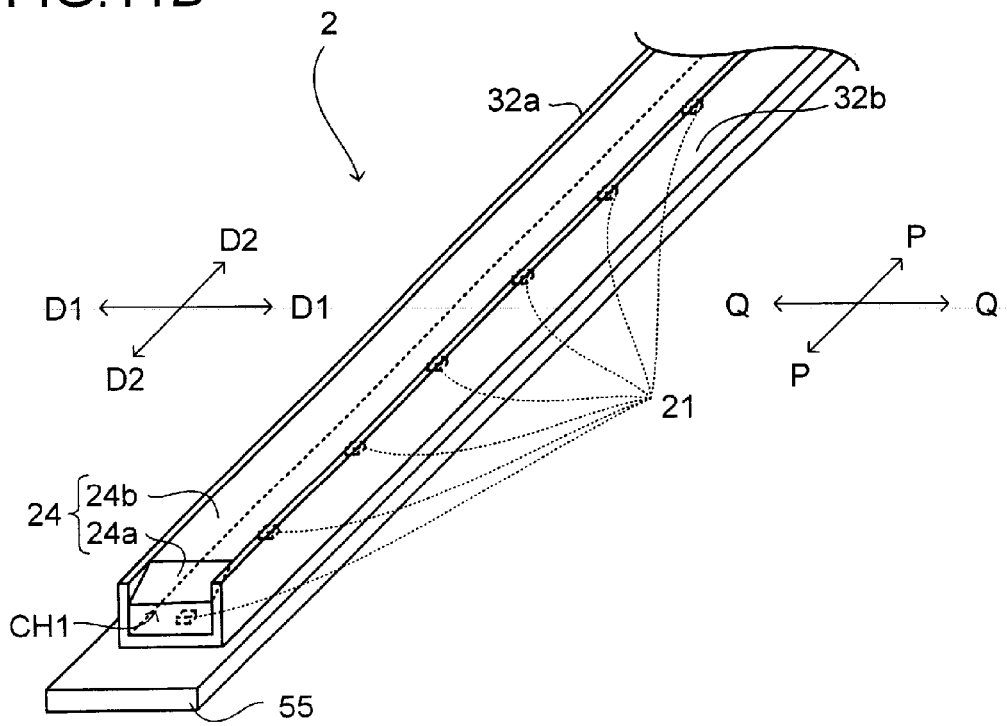
FIG. 11B is a perspective view showing the LED of FIG. 11A having a tapered sealing member.

It is to be noted that, as shown in FIG. 11B, the sealing member 24 provided in the LED 2 shown in FIG. 11A may have a shape that tapers down from the light emitting chip 21 toward the opening OP of the sealing member 24.

Finally, the disclosed techniques may be appropriately combined as preferred embodiments, including any modifications or variations made within the spirit of the invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A light emitting element comprising:
at least one light emitting chip included in a housing member provided with an opening; wherein
the housing member includes side walls; and
the housing member includes light passage portions each corresponding to a missing portion of the side walls, the light passage portions being located so as to oppose each other with the at least one light emitting chip being interposed therebetween; wherein
the light emitting element includes a sealing member arranged to allow light to pass therethrough and to cover the at least one light emitting chip;
the sealing member has a shape that tapers down from the light emitting chip to the opening of the housing member; and
the sealing member has a tapered shape as a result of a sloped plane of the sealing member, and the plane opposes a corresponding one of the light passage portions.

2. The light emitting element of claim 1, wherein the side walls are arranged in a first direction that is defined by the side walls located to oppose one another with the at least one light emitting chip interposed between the side walls, the light passage portions are arranged in a second direction that is defined by the light passage portions, and the first direction intersects with the second direction.

3. The light emitting element of claim 1, wherein inner surfaces of the side walls arranged to receive light from the at least one light emitting chip are reflecting surfaces.

4. The light emitting element of claim 1, wherein the at least one light emitting chip includes a plurality of the at least one light emitting chips arranged in a line.

5. The light emitting element of claim 1, wherein the side walls are arranged in a first direction to oppose one another with a row defined by a plurality of the at least one light emitting chips interposed between, the light passage portions are arranged in a second direction with the row of the plurality of the at least one light emitting chips sandwiched from both ends therebetween, and the first direction intersects with the second direction.

6. A light emitting element array comprising a plurality of the light emitting elements according to claim 1.

7. The light emitting element array of claim 6, wherein the light emitting elements are arranged in a line, the light passage portions of the light emitting elements are adjacent to and oppose one another, and the light passage portions are arranged in a line.

8. A backlight unit comprising:
the light emitting element array according to claim 6; and
a light guide plate arranged to receive light from the light emitting element array and to direct the light outside of the backlight unit.

9. A liquid crystal display comprising:
a liquid crystal display panel arranged to receive light that is directed from the backlight unit of claim 8.

10. The light emitting element of claim 1, wherein the housing member is mounted to a surface of a substrate.

11. A light emitting element array comprising:
a plurality of light emitting elements, each of the plurality of light emitting elements including an independently provided housing member that is arranged to house at least one light emitting chip, the independently provided housing members each include an opening; wherein
the independently provided housing members include side walls;
the independently provided housing members include light passage portions corresponding to a missing portion of the side walls;
the side walls of each independently provided housing member are arranged to oppose each other in a first direction with the at least one light emitting chip interposed between the side walls, the light passage portions of each independently provided housing member are arranged to oppose each other in a second direction with the at least one light emitting chip interposed between the light passage portions, and the first direction intersects with the second direction; and
the plurality of light emitting elements and the plurality of independently provided housing members are arranged in a line such that the light passage portions of one of the plurality of light emitting elements are adjacent and opposed to light passage portions of others of the plurality of light emitting elements.

12. The light emitting element array of claim 11, wherein the each of the plurality of light emitting elements includes a sealing member that is arranged to allow light to pass there through and cover the at least one light emitting chip, and the sealing member has a shape that tapers down from the light emitting chip to the openings of the independently provided housing members.

13. The light emitting element array of claim 11, wherein inner surfaces of the side walls arranged to receive light from the at least one light emitting chip are reflecting surfaces.

14. The light emitting element array of claim 12, wherein the sealing member has a tapered shape as a result of a sloped plane of the sealing member, and the plane opposes a corresponding one of the light passage portions.

15. The light emitting element array of claim 11, further comprising a substrate, each of the plurality of light emitting elements being arranged on a same surface of the substrate.

16. A light emitting element array comprising:
a plurality of light emitting elements, each light emitting element including at least one light emitting chip that is housed in a housing member that has an opening; wherein
the housing member has side walls;
the housing member has light passage portions corresponding to a missing portion of the side walls;
the light emitting element includes a sealing member that is arranged to allow light to pass there through and cover the at least one light emitting chip, and the sealing member has a shape that tapers down from the light emitting chip to the opening of the housing member; and
the sealing member has a tapered shape as a result of a sloped plane of the sealing member, and the plane opposes a corresponding one of the light passage portions.

* * * * *